United States Patent
Naya

(10) Patent No.: US 7,772,616 B2
(45) Date of Patent: Aug. 10, 2010

(54) SOLID-STATE IMAGING DEVICE AND IMAGING APPARATUS

(75) Inventor: Akihiko Naya, Miyagi (JP)

(73) Assignee: Fujifilm Corporation, Tokyo (JP)

( * ) Notice: Subject to any disclaimer, the term of this patent is extended or adjusted under 35 U.S.C. 154(b) by 172 days.

(21) Appl. No.: 12/230,584

(22) Filed: Sep. 2, 2008

(65) Prior Publication Data

US 2009/0065815 A1  Mar. 12, 2009

(30) Foreign Application Priority Data

Sep. 11, 2007  (JP) .......................... P2007-235616

(51) Int. Cl.
*H01L 27/148* (2006.01)
*H01L 29/768* (2006.01)
*H01L 31/0232* (2006.01)

(52) U.S. Cl. ................. 257/231; 257/435; 257/E27.15; 257/E31.122

(58) Field of Classification Search ................. 257/231, 257/435, E27.15, E31.122
See application file for complete search history.

(56) References Cited

U.S. PATENT DOCUMENTS

2002/0195628 A1  12/2002  Yamada
2008/0231733 A1*  9/2008  Fujioka et al. .............. 348/246
2008/0303108 A1*  12/2008  Kasano et al. .............. 257/432
2009/0073291 A1*  3/2009  Yoneda et al. .............. 348/273

FOREIGN PATENT DOCUMENTS

| JP | 2003-37262 A | 2/2003 |
| JP | 2005-109021 A | 4/2005 |
| JP | 2006-121112 A | 5/2006 |

* cited by examiner

Primary Examiner—David S Blum
(74) Attorney, Agent, or Firm—Birch, Stewart, Kolasch & Birch, LLP

(57) ABSTRACT

A solid-state imaging device includes a semiconductor substrate and a plurality of photoelectric conversion elements provided in the semiconductor substrate, wherein the plurality of photoelectric conversion elements include: effective photoelectric conversion elements which are photoelectric conversion elements for obtaining an imaging signal corresponding to light from a subject; and OB photoelectric conversion elements which are photoelectric conversion elements for obtaining a reference signal of an optical black level, and the solid-state imaging device further includes a first shielding layer provided at least over the effective pixel area as defined herein and having an opening provided at least over a part of the effective photoelectric conversion elements, and a second shielding layer provided over the OB pixel area as defined herein and electrically separated from the first shielding layer.

6 Claims, 3 Drawing Sheets

SOLID-STATE IMAGING DEVICE AND IMAGING APPARATUS

CROSS-REFERENCE TO RELATED APPLICATIONS

This application claims the benefit of Japanese Patent Application JP 2007-235616, filed Sep. 11, 2007, the entire content of which is hereby incorporated by reference, the same as if set forth at length.

FIELD OF THE INVENTION

The present invention relates to a solid-state imaging device having an effective pixel area where a photoelectric conversion section for obtaining an imaging signal corresponding to the light from the subject is disposed and an OB pixel area where an OB section for obtaining a reference signal of the optical black level is disposed.

BACKGROUND OF THE INVENTION

In recent years, in CCD (charge coupled device) type solid-state imaging devices, because of microminiaturization, problems have arisen such as the rise of the depletion voltage of the photoelectric conversion elements and the increase in the smear charge flowing into the CCD from the surfaces of the photoelectric conversion elements during the exposure period and the charge transfer period. Accordingly, to solve these problems, it has previously been proposed to suppress the rise of the depletion voltage of the photoelectric conversion elements by applying a positive voltage to the shielding layer during the period of charge reading from the photoelectric conversion elements to the CCD and prevent the smear charge from moving into the CCD by applying a negative voltage to a shielding layer that shields the part, other than the light receiving surface, of the photoelectric conversion elements during the period other than that (see, for example, JP-A-2005-109021).

It has also been proposed to form a transparent electrode layer on the apertures of the photoelectric conversion elements, apply a positive voltage to the transparent electrode layer during the charge reading period and apply a negative voltage thereto during the period other than the charge reading period (see, for example, JP-A-2006-121112 (corresponding to US2002/0195628A1) and JP-A-2003-37262 (corresponding to US2002/0195628A1)).

SUMMARY OF THE INVENTION

In the structure disclosed in JP-A-2006-121112 (corresponding to US2002/0195628A1) and JP-A-2003-37262 (corresponding to US2002/0195628A1), since the light receiving surfaces of the photoelectric conversion elements are covered by the transparent electrode, some of the light is absorbed by the transparent electrode, so that the optical characteristic of the imaging device is deteriorated. Moreover, OB photoelectric conversion elements for obtaining the reference signal of the optical black level and effective photoelectric conversion elements for obtaining the imaging signal corresponding to the light from the subject are generally present in the solid-state imaging device, and the shielding layer provided over the OB photoelectric conversion elements and the effective photoelectric conversion elements has an opening formed only over the effective photoelectric conversion elements. That is, the structure of the effective photoelectric conversion elements and the shielding layer in the vicinity thereof and the structure of the OB photoelectric conversion elements and the shielding layer in the vicinity thereof are different. For this reason, when a voltage is applied to the shielding layer as disclosed in JP-A-2005-109021, a difference occurs in the smear suppression effect and the depletion voltage rise suppression effect between the OB photoelectric conversion elements and the effective photoelectric conversion elements, so that the reference signal of the optical black level cannot be obtained accurately.

The present invention is made in view of the above-mentioned circumstances, and an object thereof is to provide a solid-state imaging device capable of accurately obtaining the reference signal of the optical black level without deteriorating the optical characteristic.

A solid-state imaging device of the present invention is a solid-state imaging device including a plurality of photoelectric conversion elements formed within a semiconductor substrate, the plurality of photoelectric conversion elements include: effective photoelectric conversion elements which are photoelectric conversion elements for obtaining an imaging signal corresponding to light from a subject; and OB photoelectric conversion elements which are photoelectric conversion elements for obtaining a reference signal of an optical black level, an area of the semiconductor substrate where the effective photoelectric conversion elements are provided is an effective pixel area, an area of the semiconductor substrate where the OB photoelectric conversion elements are provided is an OB pixel area, and the following are provided: a first shielding layer provided at least over the effective pixel area and having an opening formed at least over a part of the effective photoelectric conversion elements; and a second shielding layer provided over the OB pixel area and electrically separated from the first shielding layer.

In the solid-state imaging device of the present invention, the first shielding layer is formed also over the OB pixel area so as to also cover the second shielding layer over the OB pixel area.

In the solid-state imaging device of the present invention, different terminals are connected to the first shielding layer and the second shielding layer, respectively.

In the solid-state imaging device of the present invention, the terminal connected to the second shielding layer is grounded.

An imaging apparatus of the present invention is provided with: the above-described solid-state imaging device; and a driving unit for driving the solid-state imaging device, the solid-state imaging device has: a charge transfer path for transferring a charge accumulated in the photoelectric conversion elements; and a charge reader for reading the charge into the charge transfer path, the driving unit performs driving to apply a positive voltage to the first shielding layer during a first period and to apply a negative voltage to the first shielding layer during a period other than the first period, and the first period is a period including at least part of a charge reading period during which a reading voltage is applied to the charge reader to read the charge into the charge transfer path.

An imaging apparatus of the present invention is provided with the above-described solid-state imaging device; and a driving unit for driving the solid-state imaging device, the solid-state imaging device has: a charge transfer path for transferring a charge accumulated in the photoelectric conversion elements; and a charge reader for reading the charge into the charge transfer path, the driving unit performs driving to apply a positive voltage to the first shielding layer and the second shielding layer during a first period and to apply a negative voltage to the first shielding layer and the second shielding layer during a period other than the first period, the first period is a period including at least part of a charge reading period during which a reading voltage is applied to the charge reader to read the charge into the charge transfer path, an absolute value of the negative voltage applied to the terminal connected to the second shielding layer is lower than an absolute value of the negative voltage applied to the terminal connected to the first shielding layer, and the positive voltage applied to the terminal connected to the second shielding layer is lower than the positive voltage applied to the terminal connected to the first shielding layer.

According to the present invention, a solid-state imaging device can be provided that is capable of accurately obtaining the reference signal of the optical black level without deteriorating the optical performance.

EXPLANATION OF REFERENCE NUMERALS

Figure 1:
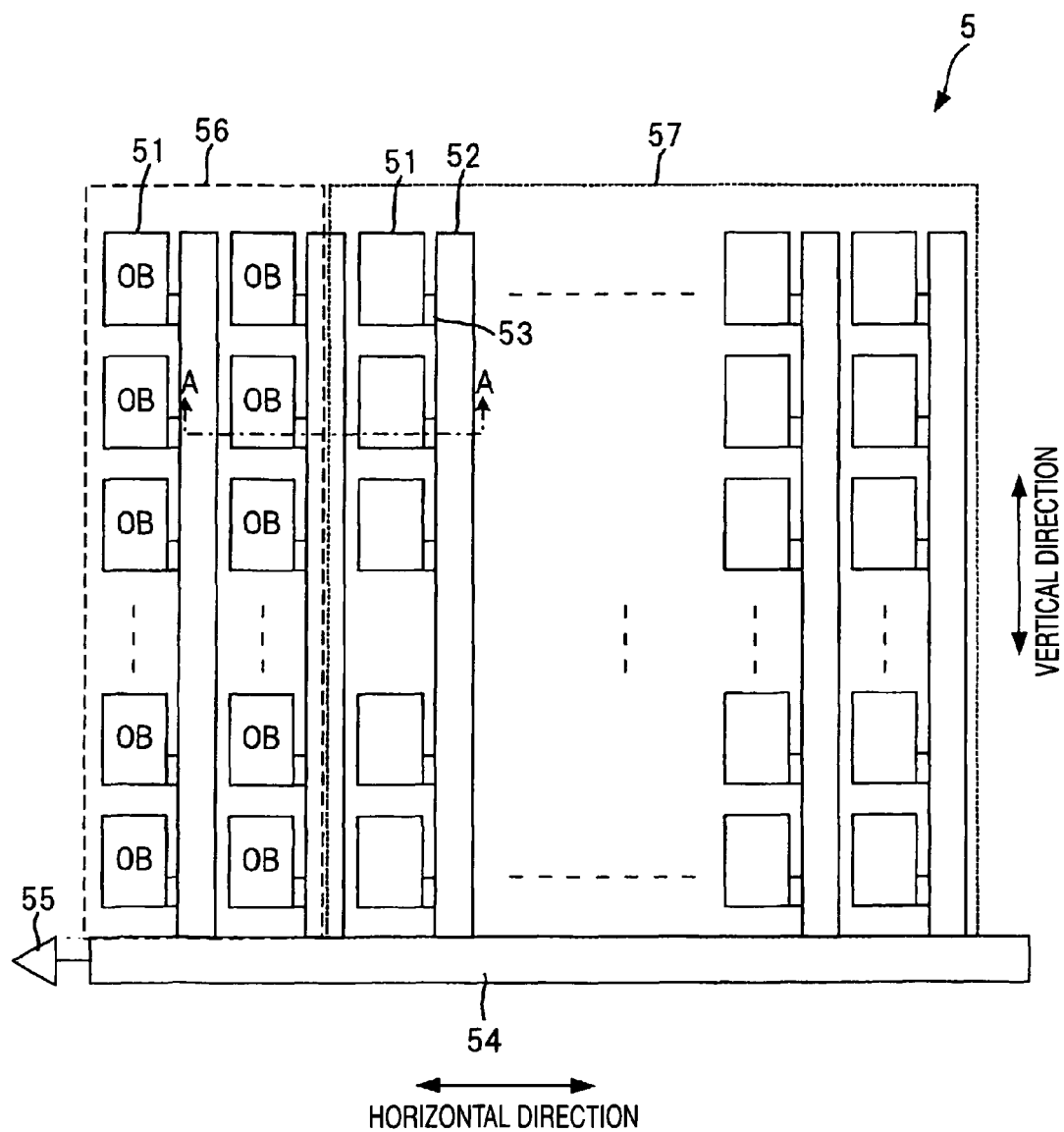
FIG. 1 is a schematic plan view showing the general structure of a solid-state imaging device according to an embodiment of the present invention.

5: Solid-state imaging device
51: Photoelectric conversion element
52: Vertical charge transfer path
53: Charge reader
54: Horizontal charge transfer path
55: Outputter
56: OB pixel area
57: Effective pixel area
58: Electrode
60, 63: Shielding layer
64, 65: Terminal

DETAILED DESCRIPTION OF THE INVENTION

Hereinafter, an embodiment of the present invention will be described with reference to the drawings.

FIG. 1 is a schematic plan view showing the general structure of a solid-state imaging device according to the embodiment of the present invention.

The solid-state imaging device 5 shown in FIG. 1 is provided with: a plurality of photoelectric conversion elements 51 arranged in square lattice form in a vertical direction and a horizontal direction orthogonal thereto within the semiconductor substrate; vertical charge transfer paths 52, each provided on the right side in correspondence with a photoelectric conversion element array consisting of a plurality of photoelectric conversion elements 51 arranged in the vertical direction, for transferring the charge accumulated in the photoelectric conversion elements 51 of the photoelectric conversion element arrays, in the vertical direction; charge readers 53 for reading the charge accumulated in the photoelectric conversion elements 51 into the vertical charge transfer paths 52 corresponding to the photoelectric conversion elements 51; a horizontal charge transfer path 54 for transferring the charge transferred on the vertical charge transfer paths 52, in the horizontal direction; and an outputter 55 that converts the charge transferred on the horizontal charge transfer path 54 into a voltage signal and outputs the signal.

The plurality of photoelectric conversion elements 51 include OB photoelectric conversion elements 51 which are photoelectric conversion elements for obtaining the reference signal of the optical black level and effective photoelectric conversion elements 51 which are photoelectric conversion elements for obtaining the imaging signal corresponding to the light from the subject. In FIG. 1, the OB photoelectric conversion elements are marked with letters "OB".

As shown in FIG. 1, the semiconductor substrate of the solid-state imaging device 5 includes an OB pixel area 56 which is an area where the OB photoelectric conversion elements 51 are provided and an effective pixel area 57 which is an area of the semiconductor substrate where the effective photoelectric conversion elements 51 are provided. While in FIG. 1, of the photoelectric conversion element arrays included in the solid-state imaging device 5, the photoelectric conversion elements included in two photoelectric conversion element arrays close to the side of the outputter 55 are the OB photoelectric conversion elements 51, the arrangement of the OB photoelectric conversion elements 51 is not limited to this example.

Figure 2:
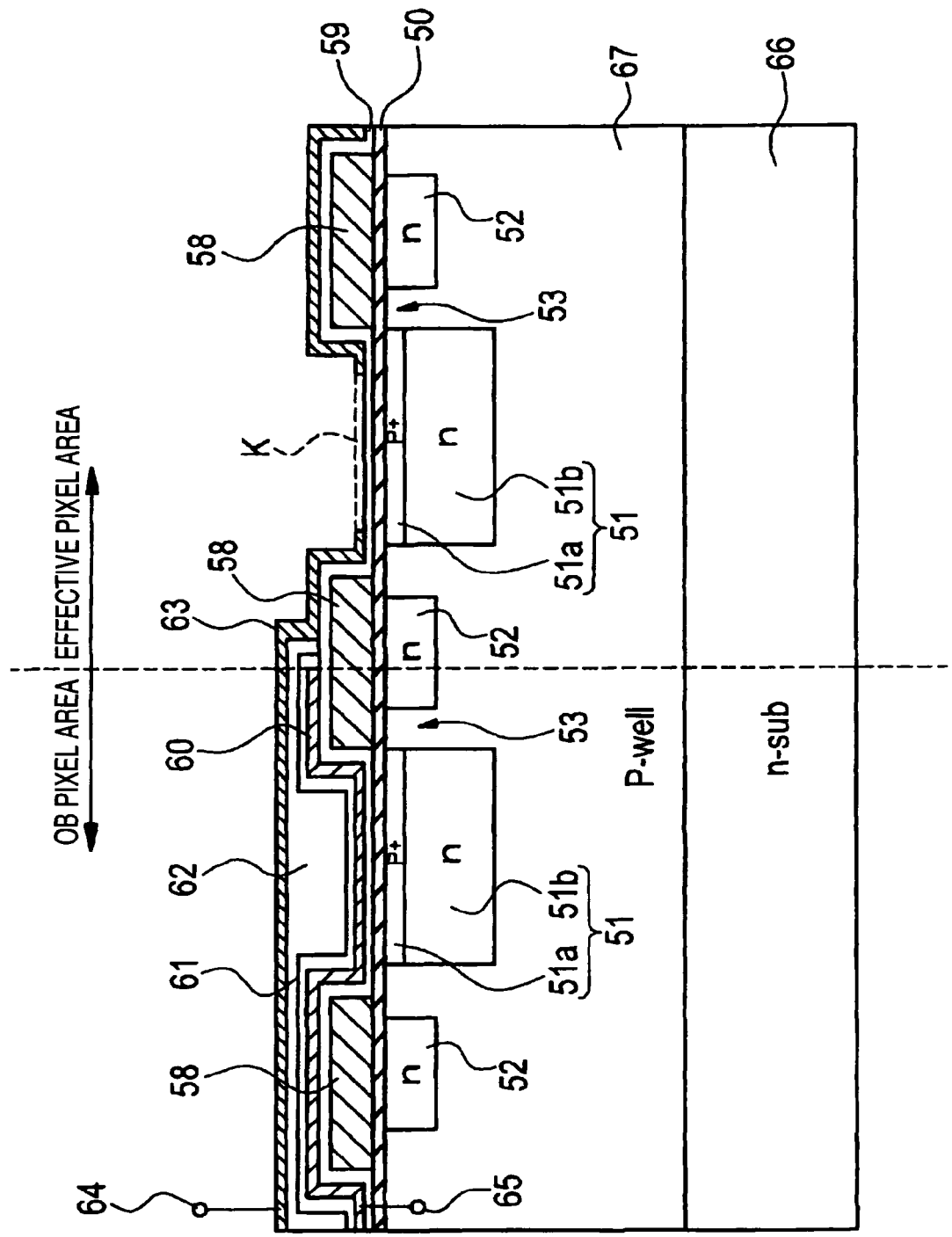
FIG. 2 is a schematic cross-sectional view taken along line A-A of FIG. 1.

FIG. 2 is a schematic cross-sectional view taken along line A-A of FIG. 1. In FIG. 2, the structure above the shielding layer (a color filter, a microlens, etc.) is not shown.

As shown in FIG. 2, the photoelectric conversion elements 51 are formed in a p-well layer 67 formed on an n-type silicon substrate 66. The above-mentioned semiconductor substrate is formed of the n-type silicone substrate 66 and the p-well layer 67. The photoelectric conversion elements 51 are each formed of a p-type impurity layer 51a formed from the surface to the inside of the p-well layer 67 and an n-type impurity layer 51b formed under the p-type impurity layer 51a. The p-type impurity layer 51a is for preventing dark current by fixing the surface potential of the photoelectric conversion element 51. The charge caused in the photoelectric conversion element 51 is accumulated in the n-type impurity layer 51b.

The vertical charge transfer path 52 formed of an n-type impurity layer is formed to the right of each photoelectric conversion element 51 in the p-well layer 67 at a distance therefrom. The charge readers 53 for reading the charge caused in the photoelectric conversion elements 51 and accumulated in the n-type impurity layers 51b into the vertical charge transfer paths 52 are formed in the p-well layer 67 between the photoelectric conversion elements 51 and the vertical charge transfer paths 52. Electrodes 58 each formed of polysilicon or the like and serving both as a charge transfer electrode for controlling the charge transfer operation by supplying a voltage to the vertical charge transfer path 52 and a charge reading electrode for controlling the charge reading operation by supplying a reading voltage to the charge reader 53 are formed over the vertical charge transfer paths 52 and the charge readers 53 with a gate insulating layer 50 in between. The gate insulating layer 50 is formed of a silicon oxide layer, an ONO layer or the like. An insulating layer 59 is formed on the gate insulating layer 50 and the electrodes 58.

A shielding layer 60 for preventing light from being incident on the OB photoelectric conversion elements 51, the vertical charge transfer paths 52 and the charge readers 53 provided in the OB pixel area 56, the electrodes 58 provided over the vertical charge transfer paths 52, and the like is formed on the insulating layer 59 over the OB pixel area 56. The shielding layer 60 is formed of a conductive material that does not transmit light (for example, tungsten or aluminum).

An insulating layer 61 is formed on the shielding layer 60, and a planarizing layer 62 is formed on the insulating layer 61.

A shielding layer 63 having an opening K formed over at least a part of the effective photoelectric conversion elements 51 is formed on the insulating layer 59 and the planarizing layer 62. The opening K determines the light reception area of the effective photoelectric conversion elements 51.

The shielding layer 60 and the shielding layer 63 are electrically separated from each other, a terminal 65 is connected to the shielding layer 60, and a terminal 64 is connected to the shielding layer 63. Consequently, voltage application can be independently performed to the shielding layer 60 and the shielding layer 63.

The solid-state imaging device having the above-described structure can be used in imaging apparatuses such as digital cameras and digital video cameras. The structure of a digital camera as an example of an imaging apparatus provided with the solid-state imaging device will be described.

Figure 3:
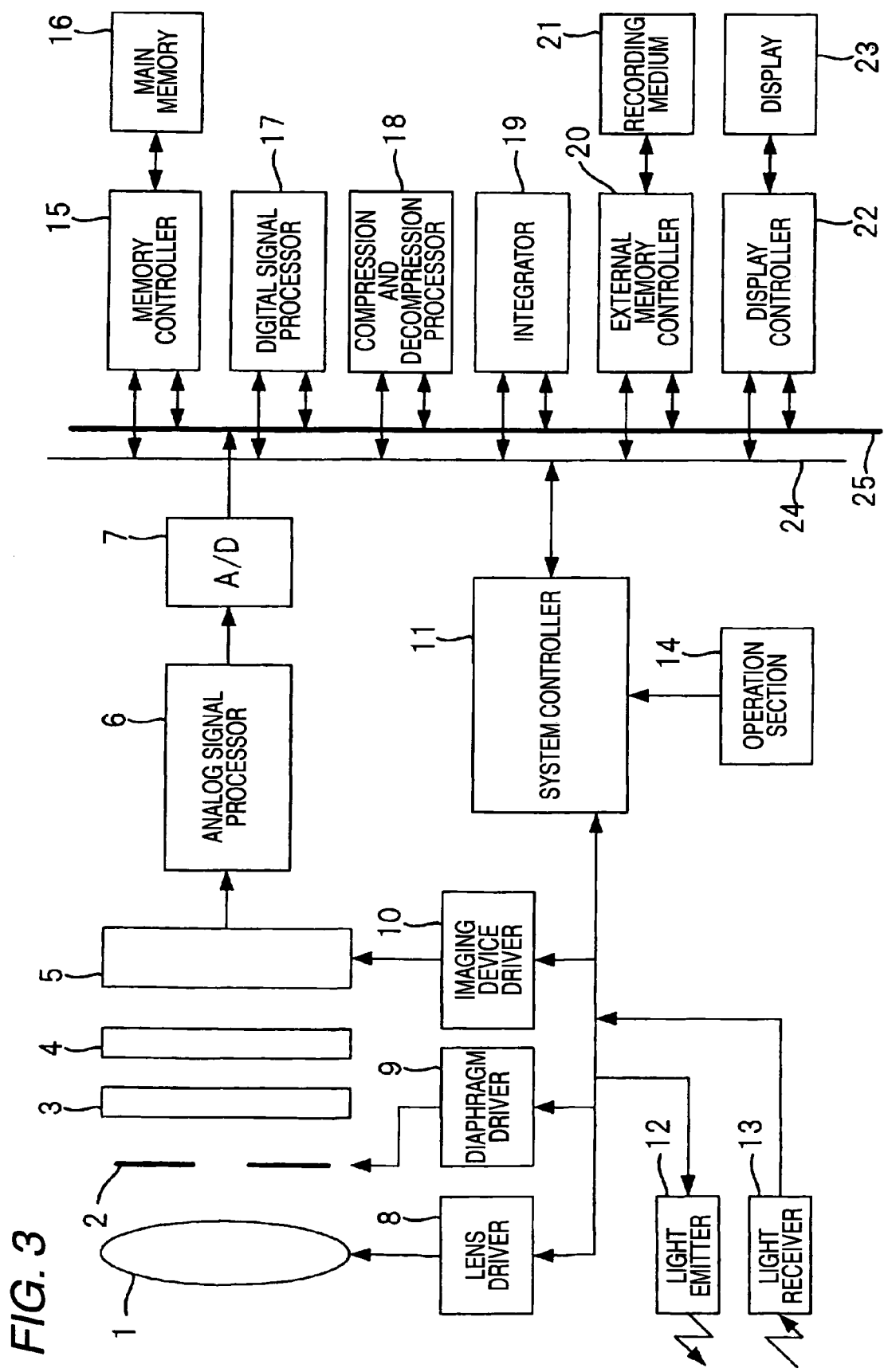
FIG. 3 is a view showing the general structure of a digital camera provided with the solid-state imaging device shown in FIG. 1.

FIG. 3 is a view showing the general structure of the digital camera provided with the solid-state imaging device shown in FIG. 1.

The imaging system of the illustrated digital camera is provided with a taking lens 1, a solid-state imaging device 5, a diaphragm 2 provided therebetween, an infrared cut filter 3, and an optical low pass filter 4.

A system controller 11 that performs centralized control of the overall electric control system of the digital camera controls a flash light emitter 12 and a light receiver 13, controls a lens driver 8 to thereby adjust the position of the taking lens 1 to the focus position, performs zoom adjustment, and controls the aperture amount of the diaphragm 2 through a diaphragm driver 9 to thereby adjust the exposure amount.

Moreover, the system controller 11 drives the solid-state imaging device 5 through an imaging device driver 10, and outputs the subject image taken through the taking lens 1, as a color signal. To the system controller 11, an instruction signal from the user is inputted through an operation section 14.

The imaging device driver 10 is connected to the terminal 64 and the terminal 65, and is capable of applying a predetermined voltage thereto.

The imaging device driver 10 applies a positive voltage to each of the terminal 64 and the terminal 65 during the charge reading period when the charge accumulated in the photoelectric conversion elements 51 during the exposure period is read into the vertical charge transfer paths 52 (the period from the application of the reading voltage to the electrodes 58 over the charge readers 53 to the end of the application of the reading voltage). Thereby, the rise of the depletion voltage of the photoelectric conversion element 51 can be suppressed.

Further, the imaging device driver 10 applies a negative voltage to each of the terminal 64 and the terminal 65 during the period other than the charge reading period. Thereby, the movement of the smear charge from the p-type impurity layer 51a to the vertical charge transfer paths 52 can be suppressed.

Since the structure of the shielding layer 63 over the effective photoelectric conversion elements 51 and the structure of the shielding layer 60 over the OB photoelectric conversion elements 51 are different, when a negative or positive voltage of the same level is applied to the terminal 64 and the terminal 65, signal reading from the effective photoelectric conversion elements 51 and signal reading from the OB photoelectric conversion elements 51 cannot be performed under the same condition. Therefore, the above-described image taking operation is performed without any light incident on the solid-state imaging device 5 at all, and the voltages applied to the terminal 64 and the terminal 65, respectively, during the charge reading period and the voltages applied to the terminal 64 and the terminal 65, respectively, during the period other than the charge reading period which voltages are such that the signal obtained from the effective photoelectric conversion elements 51 by the image taking and the signal obtained from the OB photoelectric conversion elements 51 thereby are substantially the same are previously obtained. By applying the obtained voltages to the terminal 64 and the terminal 65 at the time of image taking, signal reading from the effective photoelectric conversion elements 51 and signal reading from the OB photoelectric conversion elements 51 can be performed under the same condition. Consequently, the reference signal of the optical black level can be obtained accurately.

When the same voltage is applied to the shielding layer 60 and the shielding layer 63, the smear suppression effect and the depletion voltage rise suppression effect are higher for the OB photoelectric conversion elements 51 than for the effective photoelectric conversion elements 51. For this reason, the following relations hold for the above-mentioned previously obtained voltages: (the voltage applied to the terminal 64 during the charge reading period)>(the voltage applied to the terminal 65 during the charge reading period); and (the absolute value of the voltage applied to the terminal 64 during the period other than the charge reading period)>(the absolute value of the voltage applied to the terminal 65 during the period other than the charge reading period).

The electric control system of the digital camera is further provided with: an analog signal processor 6 connected to the output of the solid-state imaging device 5 and performing analog signal processing such as correlated double sampling processing; and an A/D-converting circuit 7 converting the RGB color signal outputted from the analog signal processor 6 into a digital signal. These are controlled by the system controller 11.

Further, the electric control system of the digital camera is provided with: a main memory 16; a memory controller 15 connected to the main memory 16; a digital signal processor 17 that performs an interpolation computation, a gamma correction computation, RGB/YC conversion processing, and the like to generate image data; a compression and decompression processor 18 that compresses the image data generated by the digital signal processor 17 into JPEG format and decompresses compressed image data; an integrator 19 that integrates photometric data and obtains the gain of the white balance correction performed by the digital signal processor 17; an external memory controller 20 to which a detachably attachable recording medium 21 is connected; and a display controller 22 to which a liquid crystal display 23 provided on the back surface or the like of the camera is connected. These are interconnected by a control bus 24 and a data bus 25, and controlled by an instruction from the system controller 11.

Next, the image taking operation by the digital camera shown in FIG. 3 will be described.

When the operation section 14 is operated to provide an image taking instruction and start the exposure period, the imaging device driver 10 applies a negative voltage to each of the terminal 64 and the terminal 65. When the exposure period ends, the imaging device driver 10 applies the reading voltage to the electrode 58, and applies a positive voltage to each of the terminal 64 and the terminal 65. The application of the positive voltage is performed until the application of the reading voltage is finished. After the application of the reading voltage is finished, the imaging device driver 10 applies a negative voltage to each of the terminal 64 and the terminal 65 again. Then, the imaging device driver 10 drives the vertical charge transfer paths 52, the horizontal charge transfer path 54, and the outputter 55 to cause a signal corresponding to the read charge from the solid-state imaging device 5, and ends the image taking operation.

As described above, according to the solid-state imaging device 5 of the present embodiment, since the shielding layer 63 provided over the effective photoelectric conversion elements 51 and the shielding layer 60 provided over the OB photoelectric conversion elements 51 are different structures that are electrically separated and voltage application can be independently performed thereto, signal reading from the effective photoelectric conversion elements 51 and signal reading from the OB photoelectric conversion elements 51 can be performed under the same condition, so that the reference signal of the optical black level can be obtained accurately.

Moreover, since the solid-state imaging device 5 of the present embodiment has no transparent electrode over the light receiving surfaces of the effective photoelectric conversion elements 51 like the devices disclosed in JP-A-2006-121112 (corresponding to US2002/0195628A1) and JP-A-2003-37262 (corresponding to US2002/0195628A1), the optical characteristic deterioration due to the provision of the transparent electrode is not caused.

Moreover, according to the solid-state imaging device 5 of the present embodiment, since the shielding layer 63 is formed so as to cover the shielding layer 60 over the OB pixel area 56, the OB pixel area 56 is doubly shielded by the shielding layer 60 and the shielding layer 63. Consequently, light does not readily enter the OB pixel area 56, so that the influence of the smear charge on the reference signal of the optical black level can be minimized.

While the terminal 65 is connected to the shielding layer 60 and a negative voltage and a positive voltage can be applied therefrom in the description given above, the terminal 65 may be grounded or may be omitted so that the shielding layer 60 is connected nowhere. In this case, image taking is performed without any light incident on the solid-state imaging device 5 at all, and the voltage applied to the terminal 64 during the charge reading period and the voltage applied to the terminal 64 during the period other than the charge reading period are previously obtained so that the signal obtained from the effective photoelectric conversion elements 51 by the image taking and the signal obtained from the OB photoelectric conversion elements 51 by the image taking are substantially the same. When the terminal 65 is omitted so that the shielding layer 60 is connected nowhere, it is unnecessary that the shielding layer 60 be formed of a conductive material.

While the shielding layer 63 is provided up to over the OB pixel area 56 in the description given above, it is necessary only that the shielding layer 63 be provided at least over the effective pixel area 57.

While a positive voltage is applied to the shielding layer 60 and the shielding layer 63 during the charge reading period from the start to the end of the application of the reading voltage and a negative voltage is applied to the shielding layer 60 and the shielding layer 63 during the period other than the charge reading period in the description given above, the depletion voltage rise can be suppressed as long as the period during which a positive voltage is applied to the shielding layer 60 and the shielding layer 63 includes at least part of the charge reading period.

While when the terminal 65 is grounded or the terminal 65 is omitted so that the shielding layer 60 is connected nowhere, a positive voltage is applied to the shielding layer 63 during the charge reading period and a negative voltage is applied to the shielding layer 63 during the period other than the charge reading period, in this case, the depletion voltage rise can be suppressed as long as the period during which a positive voltage is applied to the shielding layer 63 includes at least part of the charge reading period.

Although the invention has been described above in relation to preferred embodiments and modifications thereof, it will be understood by those skilled in the art that other variations and modifications can be effected in these preferred embodiments without departing from the scope and spirit of the invention.

What is claimed is:

1. A solid-state imaging device comprising a semiconductor substrate and a plurality of photoelectric conversion elements provided in the semiconductor substrate, wherein the plurality of photoelectric conversion elements comprise: effective photoelectric conversion elements which are photoelectric conversion elements for obtaining an imaging signal corresponding to light from a subject; and OB photoelectric conversion elements which are photoelectric conversion elements for obtaining a reference signal of an optical black level, and the solid-state imaging device further comprises a first shielding layer provided at least over an effective pixel area and having an opening provided at least over a part of the effective photoelectric conversion elements, and a second shielding layer provided over an OB pixel area and electrically separated from the first shielding layer, wherein the effective pixel area is an area of the semiconductor substrate where the effective photoelectric conversion elements are provided and the OB pixel area is an area of the semiconductor substrate where the OB photoelectric conversion elements are provided.

2. The solid-state imaging device according to claim 1, wherein the first shielding layer is provided over the OB pixel area so as to cover the second shielding layer.

3. The solid-state imaging device according to claim 1, wherein different terminals are connected to the first shielding layer and the second shielding layer, respectively.

4. The solid-state imaging device according to claim 3, wherein the terminal connected to the second shielding layer is grounded.

5. An imaging apparatus comprising:

the solid-state imaging device according to claim 1; and a driving unit for driving the solid-state imaging device, wherein the solid-state imaging device comprises: a charge transfer path for transferring a charge accumulated in the photoelectric conversion elements; and a charge reader for reading the charge into the charge transfer path, and the driving unit performs driving to apply a positive voltage to the first shielding layer during a first period and to apply a negative voltage to the first shielding layer during a period other than the first period, where the first period is a period comprising at least part of a charge reading period during which a reading voltage is applied to the charge reader to read the charge into the charge transfer path.

6. An imaging apparatus comprising:

the solid-state imaging device according to claim 3; and a driving unit for driving the solid-state imaging device, wherein the solid-state imaging device comprises: a charge transfer path for transferring a charge accumulated in the photoelectric conversion elements; and a charge reader for reading the charge into the charge transfer path, the driving unit performs driving to apply a positive voltage to the first shielding layer and the second shielding layer during a first period and to apply a negative voltage to the first shielding layer and the second shielding layer during a period other than the first period, where the first period is a period comprising at least part of a charge reading period during which a reading voltage is applied to the charge reader to read the charge into the charge transfer path, and an absolute value of the negative voltage applied to the terminal connected to the second shielding layer is lower than an absolute value of the negative voltage applied to the terminal connected to the first shielding layer, and the positive voltage applied to the terminal connected to the second shielding layer is lower than the positive voltage applied to the terminal connected to the first shielding layer.

* * * * *